(12) United States Patent
Nakamura et al.

(10) Patent No.: US 7,646,580 B2
(45) Date of Patent: Jan. 12, 2010

(54) ELECTROSTATIC CHUCK AND WAFER HOLDING MEMBER AND WAFER TREATMENT METHOD

(75) Inventors: Tsunehiko Nakamura, Kirishima (JP); Yasushi Migita, Kirishima (JP)

(73) Assignee: Kyocera Corporation, Kyoto (JP)

( * ) Notice: Subject to any disclaimer, the term of this patent is extended or adjusted under 35 U.S.C. 154(b) by 464 days.

(21) Appl. No.: 11/361,679

(22) Filed: Feb. 24, 2006

(65) Prior Publication Data

US 2006/0209490 A1    Sep. 21, 2006

(30) Foreign Application Priority Data

Feb. 24, 2005   (JP) ............................. 2005-049810

(51) Int. Cl.
   *H01L 21/683*   (2006.01)
(52) U.S. Cl. ...................... 361/234; 361/233
(58) Field of Classification Search .............. 361/234, 361/233
   See application file for complete search history.

(56) References Cited

U.S. PATENT DOCUMENTS

| 5,191,506 | A | * | 3/1993 | Logan et al. ................. 361/234 |
| 5,267,607 | A | * | 12/1993 | Wada ......................... 165/80.1 |
| 5,530,616 | A | | 6/1996 | Kitabayashi et al. |
| 5,548,470 | A | | 8/1996 | Husani et al. |
| 5,812,362 | A | * | 9/1998 | Ravi ........................... 361/234 |
| 6,028,762 | A | | 2/2000 | Kamitani |
| 6,643,115 | B2 | | 11/2003 | Sakaue et al. |
| 6,780,278 | B2 | * | 8/2004 | Hayashi et al. ........ 156/345.47 |
| 6,876,534 | B2 | * | 4/2005 | Tossell ....................... 361/234 |

FOREIGN PATENT DOCUMENTS

| JP | 02-119131 | 5/1990 |
| JP | 06-112302 | 4/1994 |
| JP | 07-018438 | 1/1995 |
| JP | 07-153825 | 6/1995 |
| JP | 07-273176 | 10/1995 |
| JP | 08-055905 | 2/1996 |
| JP | 09-213777 | 8/1997 |
| JP | 10-056054 | 2/1998 |
| JP | 11100271 | * 4/1999 |
| JP | 2002-261157 | 9/2002 |

* cited by examiner

*Primary Examiner*—Stephen W Jackson
*Assistant Examiner*—Zeev Kitov
(74) *Attorney, Agent, or Firm*—Hogan & Hartson LLP

(57) ABSTRACT

It is an object of the present invention to provide an electrostatic chuck which has a good separation response and scarcely causes gas leakage while keeping the uniformly heating property and high attracting capability for a substrate and a treatment apparatus using the chuck.

To solve the above object, an electrostatic chuck according to the present invention comprises a plate-shaped ceramic body in which one main face is a setting face to put an object to be held, the plate-shaped ceramic body having; an electrode on the other main face or inside for electrostatic attraction: a circular projected part formed in the outer circumferential rim part of the setting face, the circular projected part being brought into contact with the object: and through holes formed in the inside of the circular projected part and in the electrostatic, wherein Ra(max) and Ra(min) which denote a maximum value and a minimum value of the arithmetic mean deviation Ra of the face to be brought into contact with the object respectively satisfy $\{Ra(max) \cdot Ra(min)\}/Ra(max) \leq 0.2$.

18 Claims, 10 Drawing Sheets

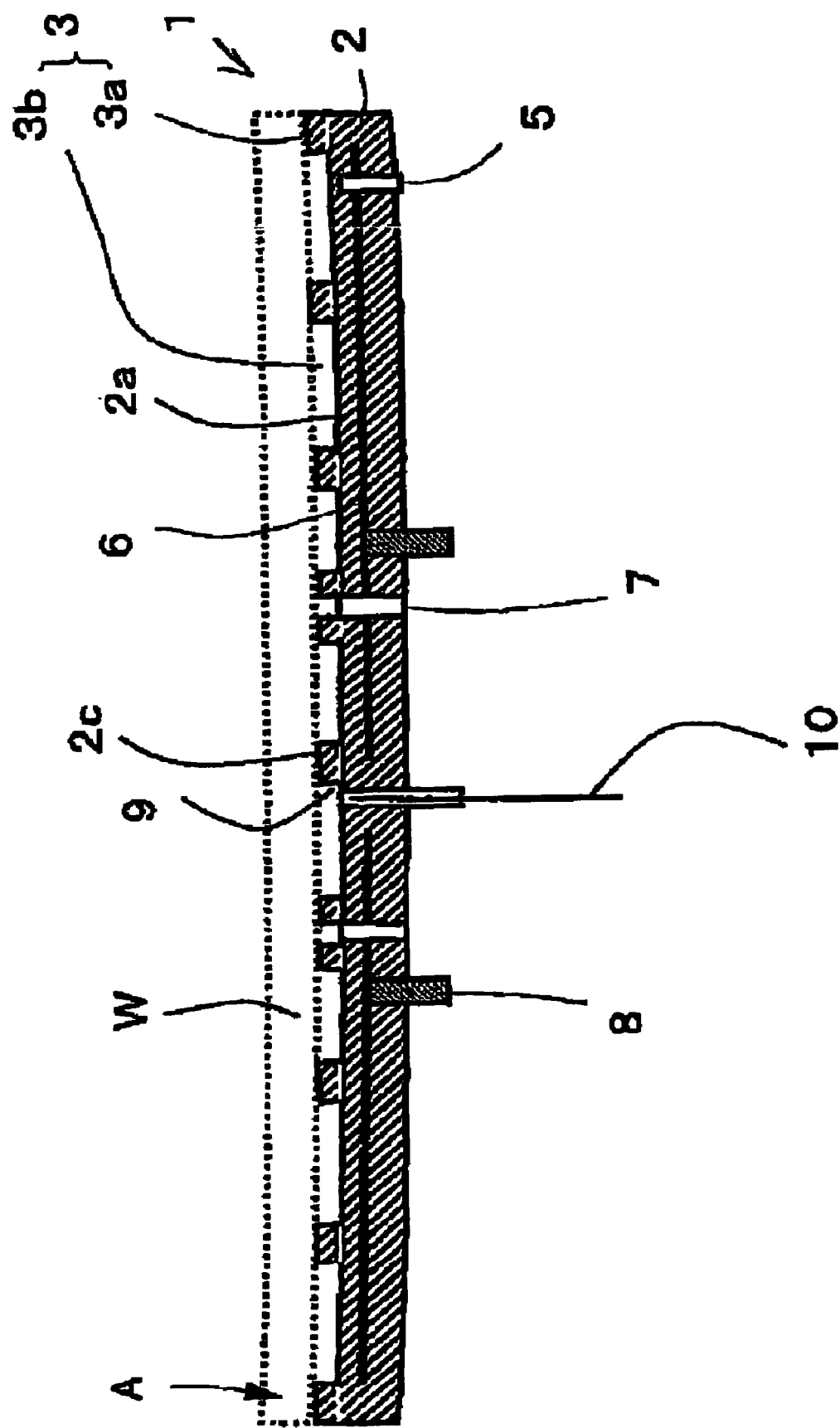

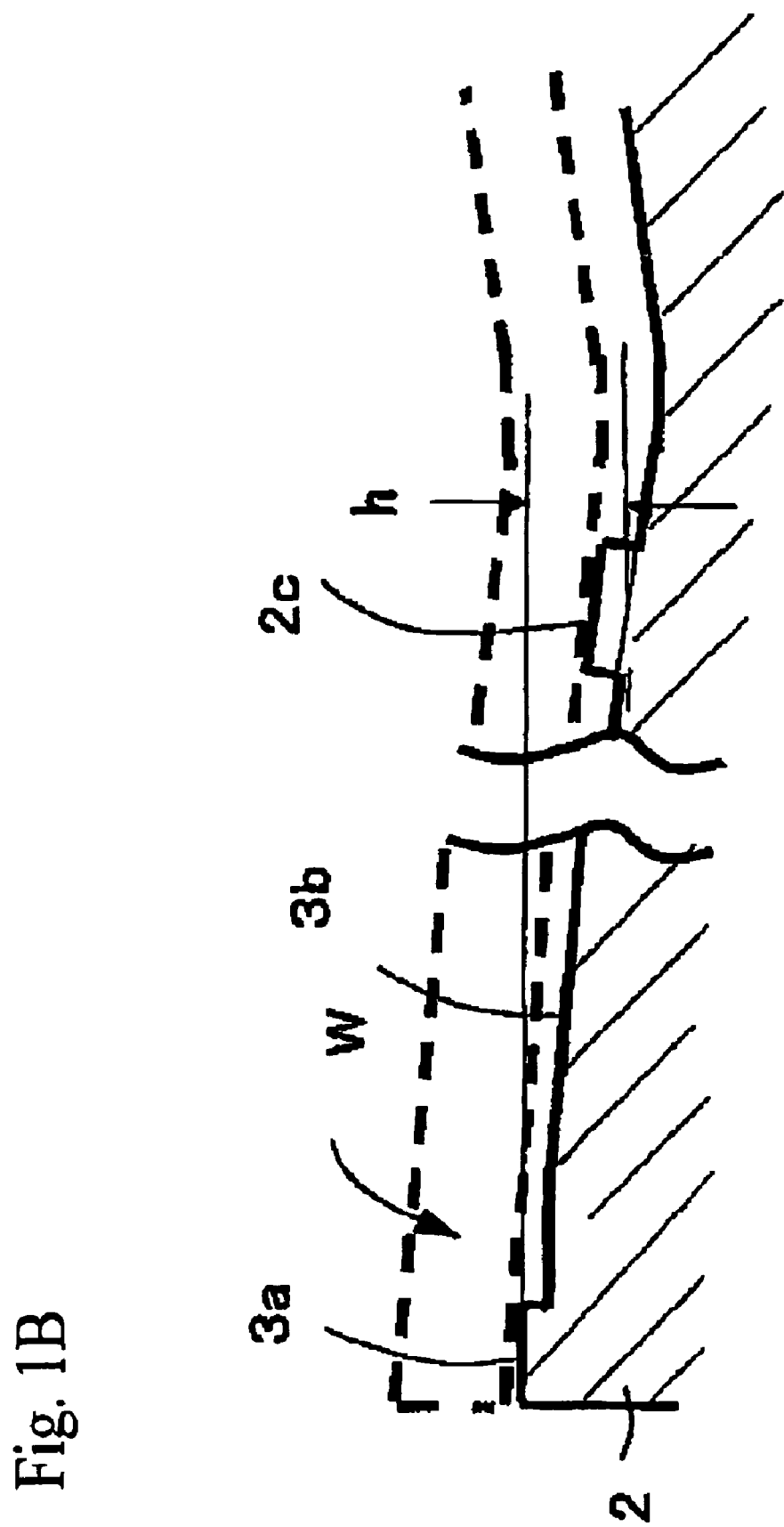

ELECTROSTATIC CHUCK AND WAFER HOLDING MEMBER AND WAFER TREATMENT METHOD

BACKGROUND OF THE INVENTION

1. Field of the Invention

The invention relates to a wafer holding member such as an electrostatic chuck in an apparatus for manufacturing semiconductors wafer and glass substrate for liquid crystal display. The wafer holding member is to be used for fixing a wafer W such as a semiconductor wafer and glass substrate for liquid crystal display.

2. Description of the Related Art

In a process of manufacturing semiconductors, to carry out film formation or etching treatment for a wafer W such as a silicon wafer at a high precision, it is required to hold the wafer W while keeping the flatness of the wafer W. Conventionally, as holding means for that, mechanical type, vacuum chuck type, or electrostatic chuck type wafer holding members have been proposed.

Among these holding means, an electrostatic chuck type wafer holding member for holding a wafer W by electrostatic force is capable of easily satisfying the requirement to keep the flatness of a wafer W needed for various kinds of treatments such as film formation and etching. Particularly, with respect to the electrostatic chuck, it is possible to use the chuck in vacuum and corrosive gas atmosphere. Therefore, an electrostatic chuck type wafer holding member has been used widely in film formation apparatuses and etching apparatuses.

Along with the advancement of the integration degree of semiconductor devices, it is strongly needed to stabilize the properties of semiconductor devices, improve the yield, and increase of the number of wafers to be treated per unit time. Therefore, it is required to heat a wafer W to an aimed temperature as quick as possible and heighten a capability of uniformly heating the entire surface of the wafer W at the time of etching or film formation.

Therefore, it has been tried to improve the heat transfer property between a wafer W and an electrostatic chuck and to keep the surface temperature of the wafer W uniformly. To improve the heat transfer property between the wafer W and the electrostatic chuck, gas supply holes for introducing an inert gas such as He and Ar and grooves or recessed parts communicated with the gas supply holes are formed in a setting face to put the wafer W on. In the case the wafer W is attached to the setting face, the spaces formed between the wafer W and the grooves or the wafer W and the recessed parts are filled with an inert gas through the gas supply holes.

Japanese Patent No. 2,626,618 (Patent Document No. 1), Japanese Patent Laid-Open Nos. 6-112302 (Patent Document No. 2) and 2-119131 (Patent Document No. 3) describe the groove shapes and the recessed shapes to be formed on the setting faces. As shown in FIG. 6, these documents disclose an electrostatic chuck 31 which is provided with a gas supply hole 34 and a plurality of radial grooves 35 communicated with the gas supply hole 34 and circular grooves 36 communicated with the respective radial grooves 35 and arranged concentrically at approximately equal intervals around the above-mentioned gas supply hole 34 on the top face of the electrostatic chuck 31 and of which the top face except the radial grooves 35, the circular grooves 36 and the gas supply hole 34 for introducing a helium gas at 13 to 133 Pa into is used as the setting face 33 for a wafer W.

Also, Japanese Patent Laid-Open No. 10-56054 (Patent Document No. 4) discloses an electrostatic chuck, as shown in FIG. 7, which is provided with a gas supply hole 44 and a plurality of radial grooves 45 communicated with the gas supply hole 44 and a single circular groove 46 communicated with the end parts of the respective radial grooves 45 on the top face of the electrostatic chuck 31; of which the top face except the radial grooves 45, the circular groove 46 and the gas supply hole 44 is used as the setting face 43 for a wafer W; and in which the setting face 43 is blast-treated to form a roughened face in the setting face 43.

As shown in FIG. 8, Japanese Patent Laid-Open Nos. 7-153825 (Patent Document No. 5), 9-213777 (Patent Document No. 6), 7-18438 (Patent Document No. 7), and 8-55905 (Patent Document No. 8) disclose an electrostatic chuck 51 which is provided with a plurality of very small projected parts 52 dotted on the disk-like top face and a circular projected part 57 in the circumferential rim of the top face; in which the top faces of the very small projected parts 52 and the circular projected part 57 are used as the setting face 53 of the wafer W; and in which a plurality of gas supply holes 54 are formed in the top face to introduce helium gas at 13 to 1333 Pa into.

Further, Japanese Patent Laid-Open No. 2002-261157 (Patent Document No. 9) discloses an electrostatic chuck which is provided with a circular projected part formed in the circumferential rim part to put a wafer W thereon and a concave face formed in the center part.

SUMMARY OF THE INVENTION

However, when the spaces formed between wafers W and the setting faces are filled with helium gas through the above-mentioned gas introduction port in the electrostatic chucks disclosed in Patent Document Nos. 1 to 9, the flow quantity of the gas leaking between the outer circumferential part of the setting faces and the circumferences of the wafers W partially differs and the heat transfer by the gas packed between the setting faces and the wafers W differs and accordingly, the risk of causing a wide temperature difference in the respective surfaces of the wafers becomes high.

Further, with respect to the electrostatic chuck 31 having the setting face as shown in FIG. 6, the surface areas surrounded with the neighboring two radial grooves 35 and the circular grooves 36 in the setting face 33 are wider in the circumferential portion than in the center portion. Therefore, the quantity of the heat transmitted to the wafer W from the setting face 33 becomes higher in the circumferential portion than in the center portion. Accordingly, in the case of the electrostatic chuck 31 having the setting face 33 as shown in FIG. 6, the facial temperature difference of the wafer W becomes significant to result in a problem that the uniformly heating property is deteriorated.

With respect to the electrostatic chuck described in Patent Document No. 3, if the pressure of the gas to be introduced is as high as several hundred Pa or higher, the shape of the setting face is reflected in the temperature distribution and there occurs a problem that the temperature difference in the wafer surface becomes significant. Further, since the attracting power is too high, residual attracting power is generated at the time of stopping the electric voltage application to worsen the separation response of an object to be held. Accordingly, throughput is lowered and the productivity is decreased.

With respect to the electrostatic chuck described in Patent Document No. 8, residual attracting power is generated at the time of stopping the electric voltage application to worsen the separation response of an object to be held and accordingly, throughput is lowered and the productivity is thus decreased and addition to the problem of the separation response, there is another problem of a high defective percentage. That is attributed to that the temperature uniformity is heightened since the surface roughness of the electrostatic chuck is uniformly and small, however the wafer is warped and gas leakage out of the minute interspace near the outer circumferential edge of the substrate occurs to cause an adverse effect on the uniformity and reproducibility of plasma treatment.

Further, with respect to the electrostatic chuck 41 shown in FIG. 7, similarly to the electrostatic chuck shown in FIG. 6, there is a problem that the temperature difference in the face of the wafer W is wide.

As described, with respect to conventional electrostatic chucks, no electrostatic chuck which is excellent in all of the properties such as the heating uniformity, the attracting property, and the separation response has been obtained yet. As a result, the conventional electrostatic chucks have problems that the throughput is decreased in a process of manufacturing the semiconductor device and that the defective percentage is increased.

Accordingly, the invention aims to provide an electrostatic chuck which has a good separation response and scarcely causes gas leakage while keeping the uniformly heating property and high attracting capability for a substrate and a treatment apparatus using the chuck.

In view of the above-mentioned state of the art, the inventors of the invention have made various investigations and accordingly have found the following.

That is, with respect to an electrostatic chuck including a circular projected part formed in the circumferential rim of a setting face of a plate-shaped ceramic body, an electrostatic attraction electrode for attracting an object to be held, and through holes penetrating the plate-shaped ceramic body, if the arithmetic means deviation Ra in the face of the circular projected part differs depending on different portions, in the portions where the arithmetic mean deviation is higher, more gas leaks between the top face of the circular projected part and the object to be projected which is put while being brought into contact with the top face and accordingly, more heat is radiated. On the other hand, in the portions where the arithmetic mean deviation is lower, gas leakage is less than that in the portions where the arithmetic mean deviation is higher and accordingly, the less heat is radiated. Therefore, the heat transfer quantity by the gas packed between the setting face of the circular projected part and the object to be held differs in the respective portions and therefore, the facial temperature difference in an object to be heated such as a semiconductor wafer and glass substrate for a liquid crystal display becomes wide. Consequently, with respect to objects to be held which are subjected to film formation or etching treatment, many defective products may possibly be produced. Accordingly, if the difference of the arithmetic means deviation Ra of the above-mentioned circular projected part is eliminated in the respectively different portions and the roughness of the top face of the circular projected part is made uniformly, the amount of gas leaking between the top face of the circular projected part and the object to be held which is put on the top face while being brought into contact with the circular projected part can be made uniformly in the entire face of the circular projected part and the uniformly heating property can thus be improved. Consequently, film formation treatment or etching treatment for a semiconductor wafer can be carried out uniformly. Further, if the arithmetic mean deviation Ra of the top face of the circular projected part is decreased as much as possible, the gas leakage amount is also decreased and holding power of the object to be held can be maintained to be high.

The inventors of the invention have consequently accomplished the invention according to the above-mentioned findings.

The invention provides an electrostatic chuck provided with a plate-shaped ceramic body having a pair of main faces, which comprises a setting face to put an object to be held at one of the main faces, an electrode for electrostatic attraction at the other main face or inside the plate-shaped ceramic body, a circular projected part formed in the outer circumferential rim part of the setting face, the circular projected part being brought into contact with the object, and through holes formed in the inside of the circular projected part, wherein Ra(max) and Ra(min) which denote a maximum value and a minimum value of the arithmetic mean deviation Ra of the face to be brought into contact with the object respectively satisfy $$\{Ra(\max) \cdot Ra(\min)\}/Ra(\max) \leq 0.2.$$

The above-mentioned electrostatic chuck according to the invention is characterized in that the plate-shaped ceramic body has a circular recessed part in an inside of the above-mentioned circular projected part.

The arithmetic mean deviation Ra means the value expressed by micrometer (μm) and calculated by the following equation:

$$R_a = \frac{1}{l}\int_0^l |f(x)|\,dx$$

wherein y=f(x) expresses the roughness curve function generated by extracting the measured length from the roughness curve in the mean line direction and the x-axis is set in the mean line direction of the extracted portion and the y-axis is set in the vertical magnification direction. A method for measuring the arithmetic mean deviation Ra is conducted according to JIS B 0601-1994.

The above-mentioned electrostatic chuck according to the invention is characterized in that the setting face has a smooth concave fare inside of the circular recessed part and the face of the circular projected part to be brought into contact with the object is projected higher than the recessed part.

The electrostatic chuck according to the invention is characterized in that the arithmetic mean deviation Ra becomes smaller toward the center of the concave face.

The electrostatic chuck according to the invention is characterized in that the electrode for electrostatic attraction is formed on the opposite to the smooth concave face and the circular recessed part in the above-mentioned electrostatic chuck.

The electrostatic chuck according to the invention is characterized in that the arithmetic mean deviation Ra of the circular projected part is in the range of 0.5 to 1.2.

The invention also provides a wafer holding member having a heat radiating sheet in the other main face side of the above-mentioned electrostatic chuck.

The wafer holding member according to the invention is further provided with a cooling member in the undersurface side of the heat radiating sheet.

The wafer holding member according to the invention is obtained by joining the electrostatic chuck, the heat radiating sheet, and the cooling member by an organic adhesive in this order.

The wafer holding member according to the invention is characterized in that a volume resistivity of the plate-shaped ceramic body at 40° C. is in the range of $10^8$ to $10^{12}$ Ω·cm.

The wafer holding member according to the invention is characterized in that the plate-shaped ceramic body contains alumina or aluminum nitride as a main component.

The wafer holding member according to the invention is characterized in that the plate-shaped ceramic body contains alumina or aluminum nitride as a main component and Group 4 element compound as a trace component.

The invention also provides a method for treatment of wafer comprising steps of:

putting a wafer on the setting face of the above-mentioned electrostatic chuck;

attracting the wafer by the electrode for attraction formed in the electrostatic chuck; and carrying out at least one of film formation treatment of a semiconductor thin film, etching treatment, and resist film formation treatment on the wafer.

According to the method for treatment of wafer, since the gas packed between the setting face and the wafer leaks uniformly from the respective portions of the circumferential rim of the setting face, the temperature difference in the wafer surface can be narrowed.

Further, the invention provides a method for treatment of wafer comprising steps of:

putting a wafer on the setting face of the above-mentioned wafer holding member and attracting the wafer by the electrode for attraction formed in the wafer holding member;

supplying the gas into the through-holes;

heating the wafer by the resistor heating element simultaneously with attraction of the wafer during discharging the gas out of the space between the circular recessed part of the setting face and the wafer; and carrying out at least one of film formation treatment of a semiconductor thin film, etching treatment, and resist film formation treatment on the wafer.

According to the method for treatment of wafer, since the gas packed between the setting face and the wafer leaks uniformly from the respective portions of the circumferential rim of the setting face, the temperature difference in the wafer surface can be narrowed and accordingly, the wafer is heated to a desired temperature.

As described, according to the invention, it is made possible to provide an electrostatic chuck and a wafer holding member capable of narrowing the temperature difference in the face of a wafer, shortening the separation time of the wafer W, decreasing the amount of the gas leakage, and having a high attraction power by forming a circular projected part in the circumferential rim of the setting face and a circular recessed part in the inside and adjusting the ratio of the arithmetic mean deviation of the circular projected part to be 0.2 or lower. Also, it is made possible to provide a wafer holding member usable for various film formation steps and etching steps since the leakage amount of the gas supplied between the setting face and the wafer W.

BRIEF DESCRIPTION OF THE DRAWINGS

FIG. 1A is a schematic cross-sectional view of one example of an electrostatic chuck of the invention.

FIG. 1B is an enlarged sectional view of a part represented as A of electrostatic chuck shown in FIG. 1A.

DETAILED DESCRIPTION OF THE PREFERRED EMBODIMENTS

Figure 2:
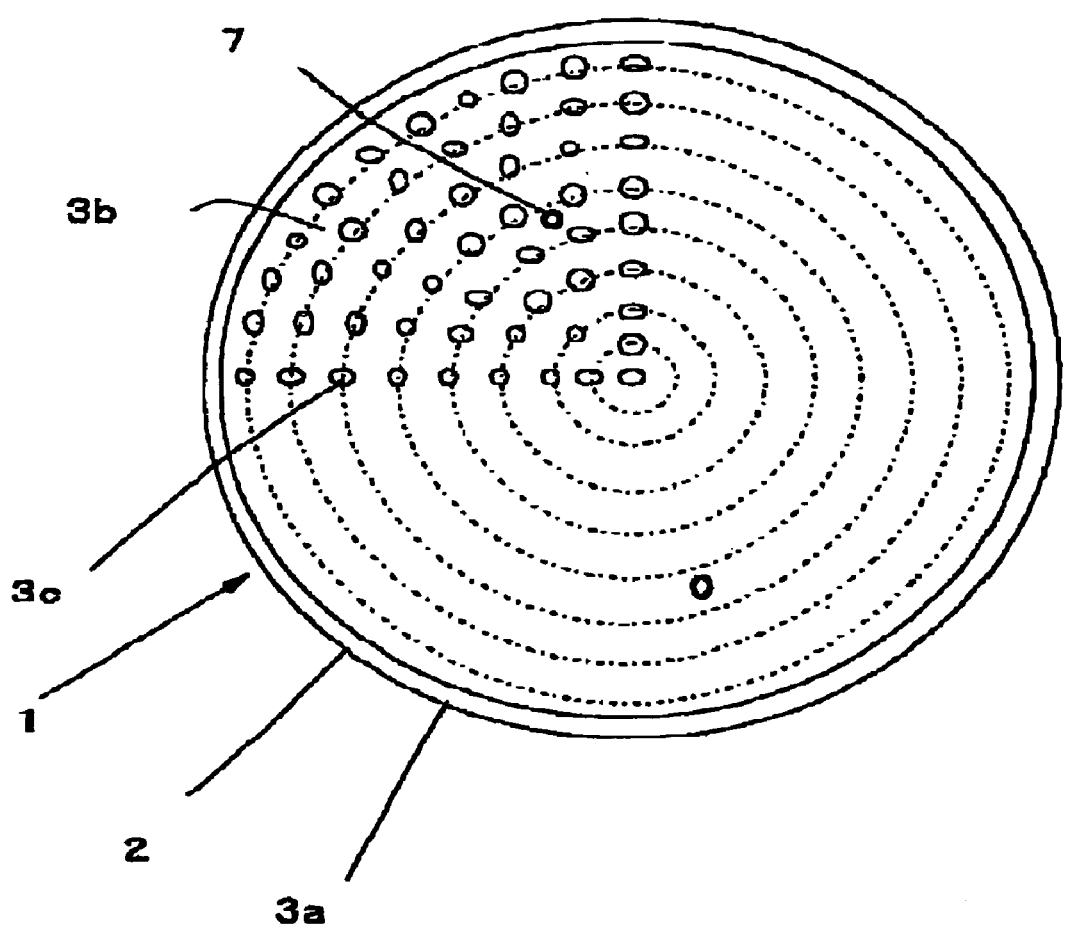
FIG. 2 is a schematic top face drawing of the setting face of the electrostatic chuck of the invention shown in FIG. 1A.

An electrostatic chuck 1 according to an embodiment of the invention includes a plate-shaped ceramic body 2, one main face of which is a setting face 3 to put an object to be held thereon and the other main face or its inside is provided with an electrode 6 for electrostatic attraction. In the plate-shaped ceramic body 2, a circular recessed part 4 is formed apart from the outer circumferential rim part accordingly the outer side of the circular recessed part 4 forms a circular projected part 3a. Also a smooth concave face 3b (the smooth concave face is to be used as a gas packing face) is formed in the inside of the circular recessed part 4 and the above-mentioned circular projected part 3a is projected higher than the above-mentioned concave face 3b and through holes 5 (the through holes 5 are to be used as gas supply holes) are formed in the inside of the circular projected part 3a. In the above-mentioned electrostatic chuck 1, $\{Ra(max)-Ra(min)\}/Ra(max)$ is adjusted to be 0.2 or lower wherein Ra(max) and Ra(min) respectively denote the maximum value and the minimum value of the arithmetic mean deviation Ra of the face to be brought into contact with the object to be held. The method for measuring the arithmetic mean deviation Ra is conducted according to JIS B060-1994. The electrostatic chuck according to this embodiment of the invention will be described more in detail with reference to the drawings.

FIG. 1A shows a cross-sectional view of one example of an electrostatic chuck 1 of the invention and FIG. 1B shows an enlarged sectional view of a part represented as A of electrostatic chuck shown in FIG. 1A. FIG. 2 shows a top face.

The electrostatic chuck 1 has a plate-shaped ceramic body 2 having a setting face 3 to put a wafer W, which is an object to be held, thereon in one main face and an electrode 6 for electrostatic attraction in the other main face or inside of the other main face and is provided with a circular projected part 3a in the circumferential rip of the setting face 3, a gas packing face 3b in the inside of the circular projected part 3a, and through holes 5 communicated with the circular projected part 3a. And the electrostatic chuck 1 may comprise a plurality of convexities for supporting a wafer W on the gas packing face 3b if needed. The convexity may be a circular cylinder or a rectangular cylinder.

The electrode 6 for electrostatic attraction is installed in the other main face or in the inside of the other main face of the plate-shaped ceramic body 2 and electricity supply terminals 8 are connected with the electrode 6 for electrostatic attraction. The electrode 6 for electrostatic attraction may be a unipolar electrode or a bipolar electrode or may be divided into a plurality, three or more, portions.

The reference numeral 10 denotes a temperature measuring element for measuring the temperature of the electrostatic chuck 1.

The plate-shaped ceramic body 2 is provided with a plurality of lift pin holes 7 and the lift pins (not illustrated) are enabled to move up and down in the lift pin holes 7.

A wafer W put on the lift pins projected out of the lift pin holes 7 can be put on the setting face 3 by moving the lift pins downward. The wafer W, an object to be hold, is held on the setting face 3 composed of the circular projected part 3a and the gas packing face 3b. Direct current voltage is applied to the electrode 6 for electrostatic attraction to firmly attract the wafer W to the setting face 3.

Simultaneously with the firm attraction of the wafer W, a gas such as helium gas and argon gas is supplied from the through holes 5 penetrating the plate-shaped ceramic body to fill the spaces formed between the wafer W and the circular projected part 3a and between the circular recessed part 4 and the gas packing face 3b. The undersurface of the circular projected part 3a has a plane contact with the circumferential rim of the wafer W and accordingly, leakage of the gas is limited. Therefore, the gas is supplied to the circular recessed part 4 and the gas packing face 3b surrounded with the circular projected part 3a. The gas is supplied through the through holes 5 and uniformly spread in the circular recessed part and packed in the gas packing face 3b forming small gaps to the wafer W. Also a very slight amount of the gas flows out to the outside from the contact interface of the circular projected part 3a and the wafer W. The wafer W receives heat from the circular recessed part 4 and the gas packing face 3b using the gas as a medium and the heat is transmitted to the rear face of the wafer W and the temperature in the wafer face is made uniformly and if a film formation gas is supplied in such a state, an uniformly film can be deposited on the surface of the wafer W to be processed and if an etching gas is supplied, the surface of the wafer W to be processed can be processed uniformly.

Figure 3A:
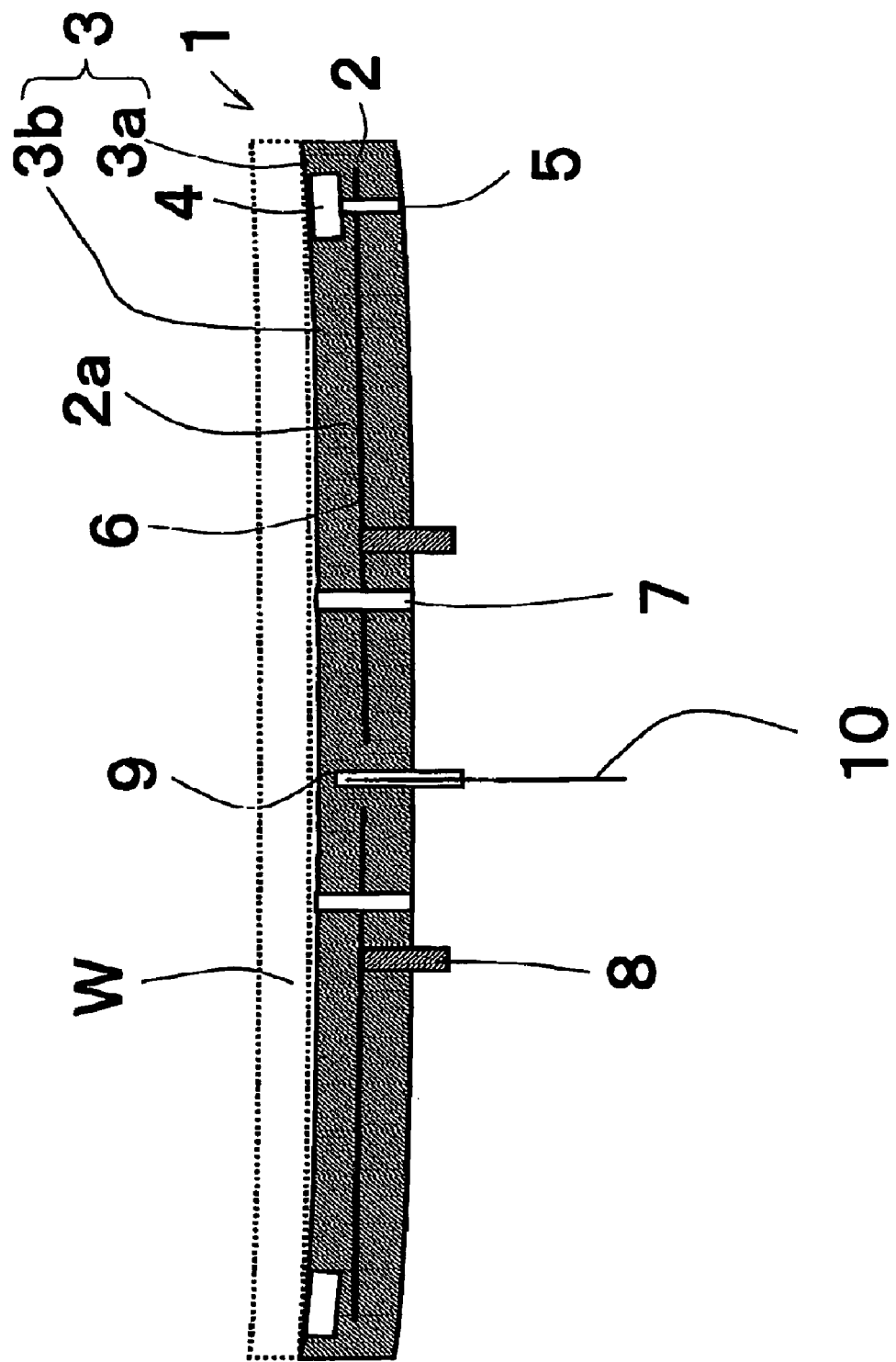
FIG. 3A is a schematic cross-sectional view of other example of an electrostatic chuck of the invention.
Figure 3B:
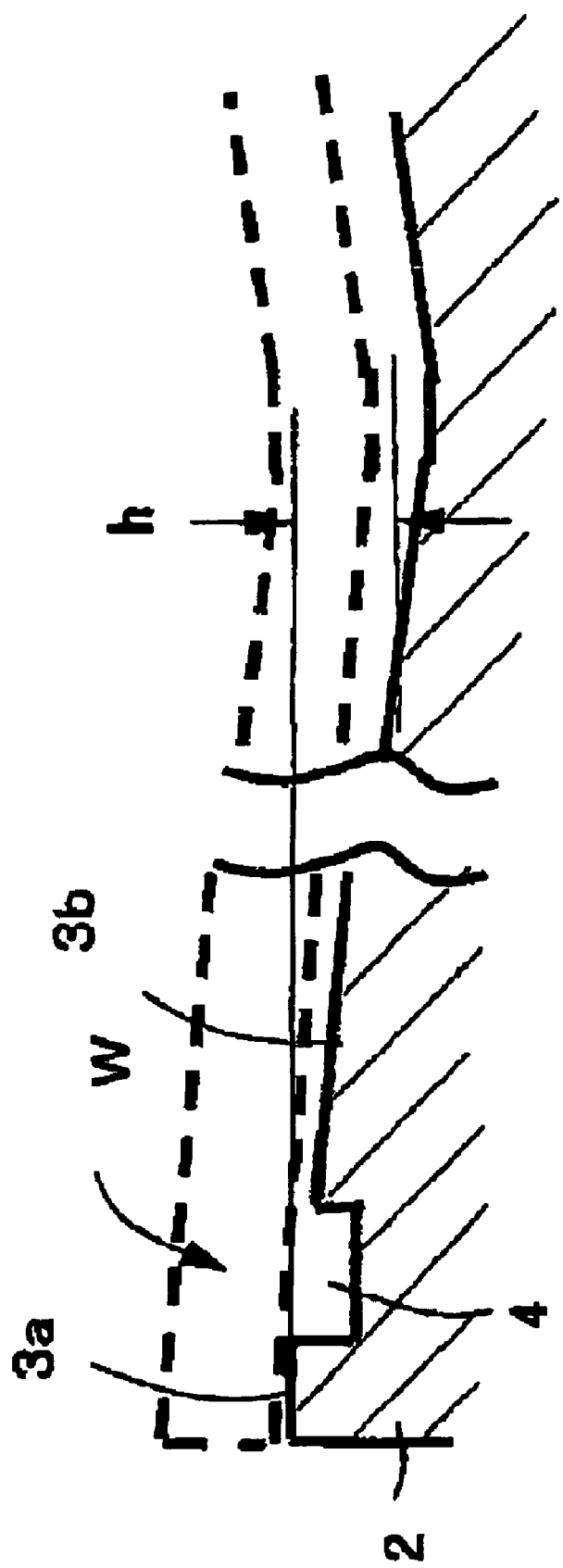
FIG. 3B is an enlarged sectional view of a part represented as B of electrostatic chuck shown in FIG. 3A.
Figure 4:
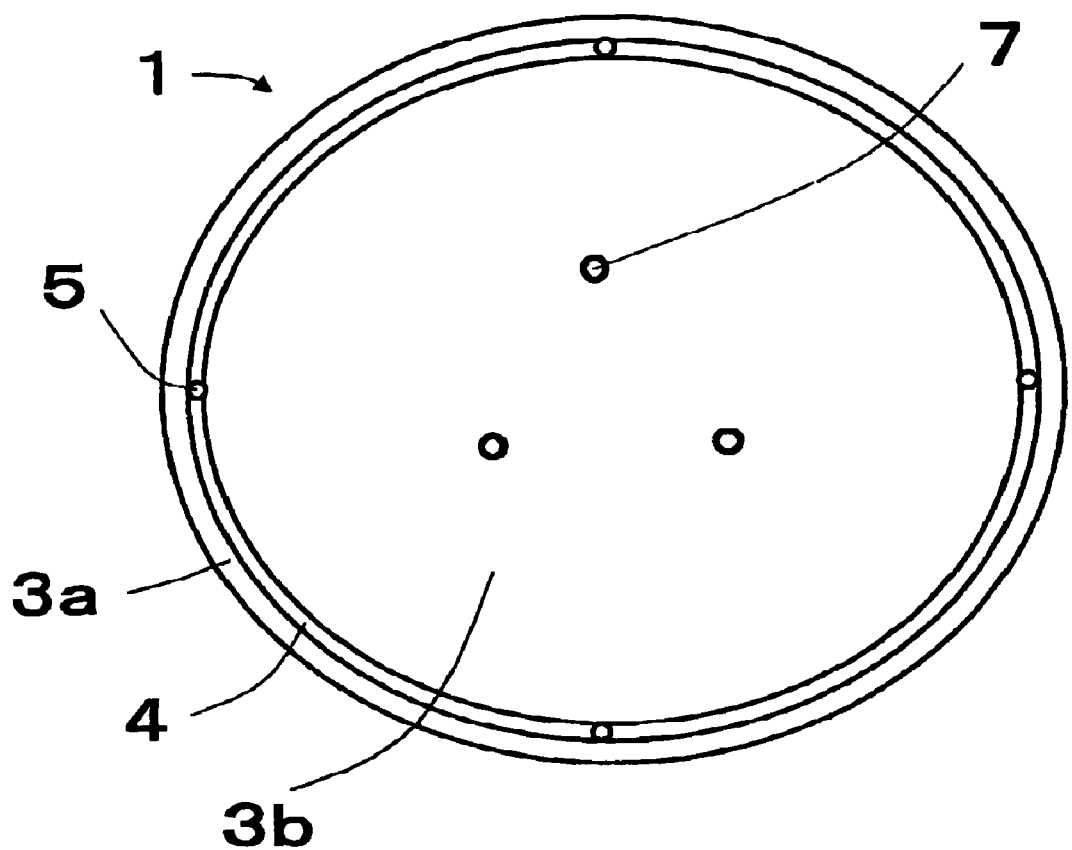
FIG. 4 is a schematic top face drawing of the setting face of the electrostatic chuck of the invention shown in FIG. 3A.

FIG. 3A shows a cross-sectional view of other example of an electrostatic chuck 1 of the invention and FIG. 3B shows an enlarged sectional view of a part represented as B of electrostatic chuck shown in FIG. 3A FIG. 4 shows a top face.

The electrostatic chuck 1 has a plate-shaped ceramic body 2 having a setting face 3 to put a wafer W, which is an object to be held, thereon in one main face and an electrode 6 for electrostatic attraction in the other main face or inside of the other main face and is provided with a circular projected part 3a in the circumferential rip of the setting face 3, a circular recessed part 4 in the inside of the circular projected part 3a, a gas packing face 3b (smooth concave face) in the inside of the circular recessed part 4, and through holes 5 communicated with the circular recessed part 4. The electrode 6 for electrostatic attraction is installed in the other main face or in the inside of the other main face of the plate-shaped ceramic body 2 and electricity supply terminals 8 are connected with the electrode 6 for electrostatic attraction. The electrode 6 for electrostatic attraction may be a unipolar electrode or a bipolar electrode or may be divided into a plurality, three or more, portions.

The electrostatic chuck 1 of the invention is characterized in that the circular recessed part 4 and the through holes 5 are communicated and the ratio of the difference of the maximum value Ra(max) and the minimum value Ra(min) of the arithmetic mean deviation Ra of the top face of the circular projected part 3a is adjusted to be 0.2 or lower. If the ratio exceeds 0.2, the dispersion of the arithmetic mean deviation of the circular projected part 3a becomes wide and the amount of the gas leaking through the contact face of the circular projected part 3a and the wafer W differs in the respective portions of the circular projected part 3a and in the portions of the circular projected part 3a where the amount of the leaking gas is high, the temperature of the surface of the wafer W is decreased. On the other hand, in the vicinities of the portions of the circular projected part 3a where the amount of the leaking gas is small, the temperature of the surface of the wafer W is relatively increased to widen the temperature difference within the face of the wafer W and the uniformity of the temperature is deteriorated. It is therefore needed that the amount of gas leaking out of the contact interface between the circular projected part 3a and the wafer W is constantly uniform. Particularly, if gas pressure of the gas supplied through the gas supply holes 5 to the very small spaces formed among the circular recessed part 4 surrounded with the circular projected part 3a, the gas packing face 3b, and the wafer W is increased to 3 kPa or higher, the amount of gas leaking the gaps between the circular projected part 3a and the wafer W is increased relatively high and correspondingly to the difference of the arithmetic mean deviation Ra of the circular projected part 3a, the amount of the gas leaking out of the gaps fluctuates considerably. If the width of the circular projected part 3a is 1 to 10 mm, it is easy to control the gas leakage and therefore it is preferable. The width is more preferably 1 to 3 mm.

With respect to the arithmetic mean deviation Ra, the value is measured at least at 6 points at approximately uniformly intervals in the circular projected part 3a and the ratio can be calculated from the maximum value and the minimum value.

The top face 3a of the circular projected part 3a is preferable to be higher than the gas packing face 3b formed in the inside of the circular recessed part 4 and it is preferable to form a concave face from the circular projected part 3a to the center of the gas packing face 3b. The wafer W put on the setting face 3 is put on the gas packing face 3b while being brought into contact with the circular projected part 3a and firmly attracted by the electrostatic attraction power. If the top face 3a of the circular projected part 3a is higher than the gas packing face 3b, the circular projected part 3a and the undersurface of the circumferential rim of the wafer W are reliably brought into contact with each other and thus gas leakage can efficiently be suppressed. Further, if the smooth concave face is formed from the circular projected part 3a to the center of the gas packing face 3b, the gas supplied from the circular recessed part 4 is easy to flow to the gas packing face 3b and the temperature difference in the surface of the wafer W can be narrowed. Further, in the state that the wafer W is attracted, the face of the wafer W is slightly deformed to be a concave face and at the time of separation of the wafer W from the setting face 3 by stopping voltage application of the electrode 6 for electrostatic attraction, uniformly if the residual attraction power remains in the wafer W, power of separating the wafer W from the setting face 3 works by the slight warping power of the wafer W and thus the wafer W is easily separated from the setting face 3.

The arithmetic mean deviation Ra of the gas packing face 3b is preferable to be high in the circumferential rim part and small in the center part. If the arithmetic mean deviation Ra is high in the circumferential rim part of the gas packing face 3b, the gas can flow smoothly from the circular recessed part 4 to the gas packing face 3b. Practically the arithmetic mean deviation Ra in the circumferential rim of the gas packing face 3b is preferably 0.5 to 1.2 μm and more preferably 0.7 to 0.9 μm. The arithmetic mean deviation in the center part of the gas packing face 3b is preferable to be smaller than the arithmetic mean deviation in the circumferential rim part of the gas packing face 3b. It is made possible to properly fill the gap between the wafer W and the setting face 3 by controlling the arithmetic mean deviation Ra as described and the wafer W is deformed in the recessed state, the wafer W is warped and the separation property is thus improved when the applied voltage to the electrode for electrostatic attraction is stopped.

It is preferable that the electrode 6 for electrostatic attraction is laid from the vicinity of the center of the plate-shaped ceramic body to the position under the circular recessed part (on the inside of the periphery of the circumferential rim of the plate-shaped ceramic body): the arithmetic mean deviation Ra of the circular projected part is 0.5 to 1.2 μm: and the average height of the circular projected part is higher than the average height of the gas packing face 3b. In the case the outer diameter of the wafer W is 300 mm or wider, it is preferably the average height of the circular projected part 3a is higher than the average height of the gas packing face 3b and the difference is 8 to 100 μm. The difference is more preferably 10 to 20 μm. If the electrode 6 for electrostatic attraction is extended to the position under the circular recessed part 4, the electrostatic attraction power in the circular projected part 3a becomes high. Also, if the arithmetic mean deviation Ra of the circular projected part 3a is 0.5 to 1.2 μm, leakage of the packed gas can properly be suppressed. In this connection, to embed the electrode 6 for electrostatic attraction from the position under the circular recessed part 4 and the circular projected part 3, it is necessary to precisely control the shrinkage of the ceramic sintered body. The electrode 6 for electrostatic attraction is preferable to be formed in the undersurface of a plate-shaped ceramic body 2. That is because the electrode for electrostatic attraction can be installed at a high positioning precision. If the electrode 6 for electrostatic attraction is allocated into the position under the circular projected part 3, the electrode 6 for electrostatic attraction is not electrically isolated with plasma environment generated above the wafer because the electrode 6 is exposed from the edge wall of the plate-shaped ceramic body. Uniformly if the electrode 6 is not exposed from the edge wall, the distance from the electrode 6 to the edge wall is shorted to decrease a dielectric strength voltage between the plasma environment and the electrode 6. Therefore, it is preferred that the electrode 6 for electrostatic attraction is allocated into the position under the circular projected part 3. This is particularly true for the plate-shaped ceramic body, an undersurface of which is provided with the electrode 6. With respect to the average height of the gas packing face 3b, the average height can be calculated as the average value of four middle points in the case the gas parking face 3b is uniformly divided into five sections in the longer diameter direction.

Figure 5:
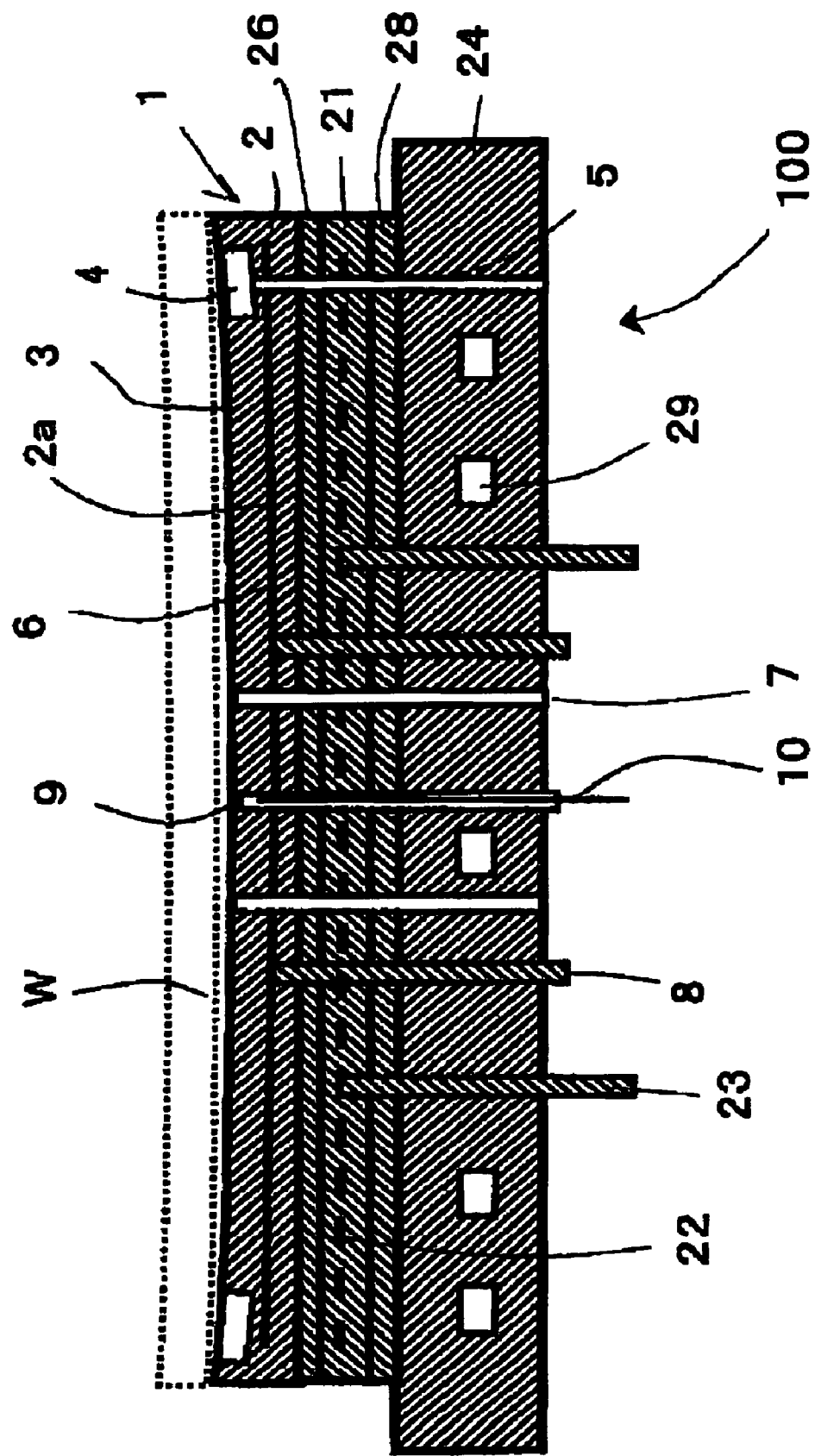
FIG. 5 is a cross-sectional view of a wafer holding member using the electrostatic chuck of the invention.
Figure 6:
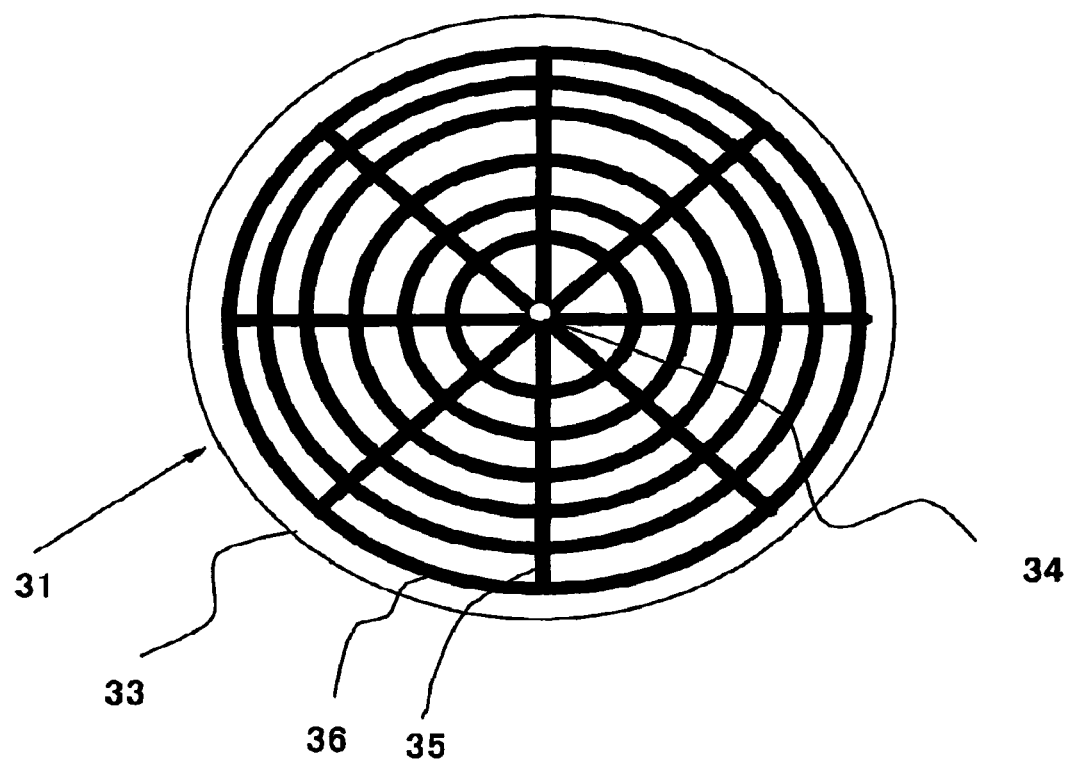
FIG. 6 is a top face drawing of the setting face of a conventional electrostatic chuck.
Figure 7:
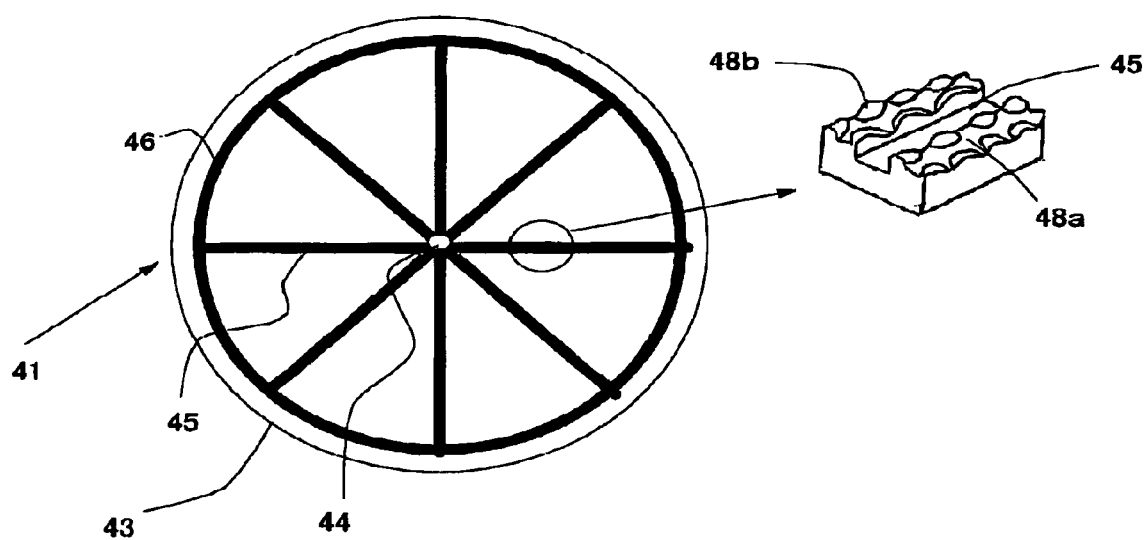
FIG. 7 is a top face drawing of the setting face of a conventional electrostatic chuck.
Figure 8:
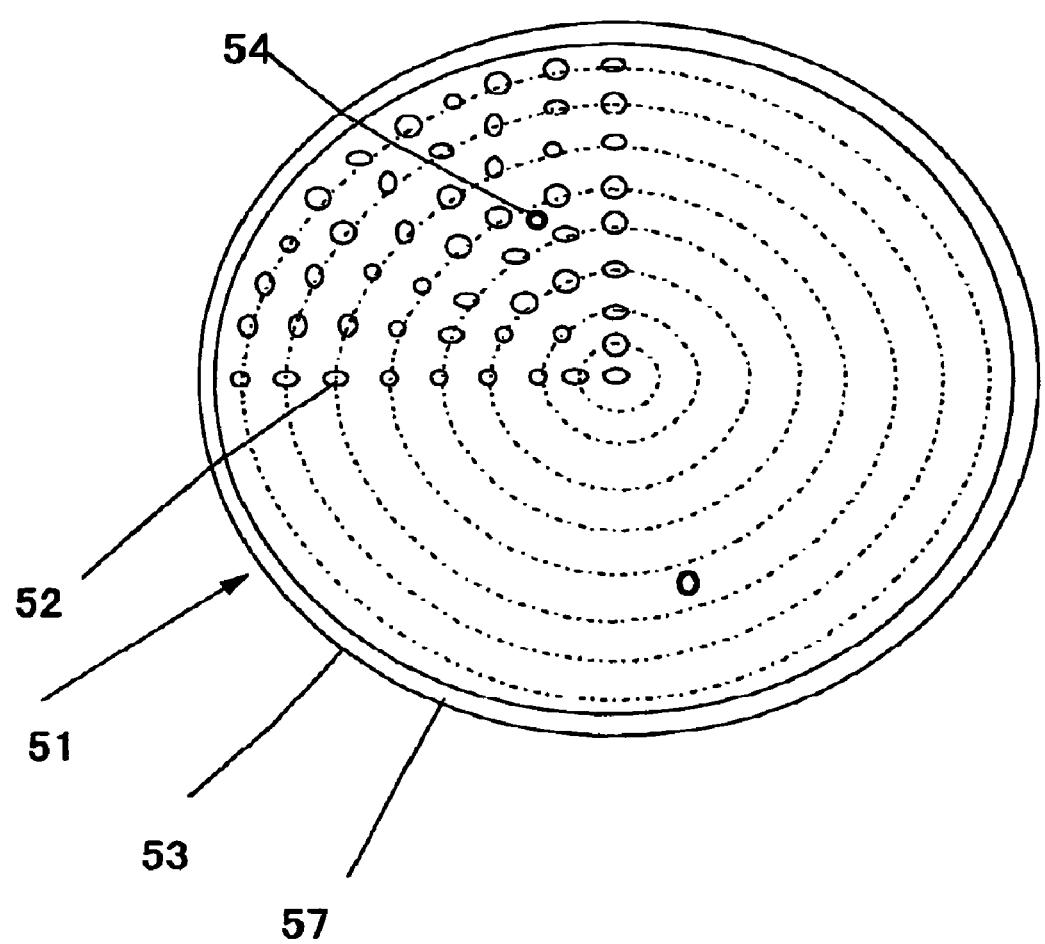
FIG. 8 is a top face drawing of the setting face of a conventional electrostatic chuck.

It is also preferable that a heat radiating sheet 21 is installed in the other main face of the electrostatic chuck 1. As shown in FIG. 5, the heat radiating sheet 21 is produced by covering a resistor heating element 22 with an insulating sheet. Electric power supply terminals 23 are connected with the resistor heating element 22. The resistor heating element 22 is heated by supplying electric power through the electric power supply terminals 23. Accordingly, the wafer W can be heated to a desired temperature by the resistor heating element of the electrostatic chuck 1. Particularly, when helium is used as the above-mentioned gas and the gas pressure is adjusted to be 300 Pa or higher, the heat from the heat radiating sheet 21 is transmitted to the setting face 3 and therefore, heat can well be transmitted to the wafer W from the setting face 3. Consequently, the temperature difference in the face of the wafer W can be narrowed.

It is also preferable to install a cooling member 24 in the undersurface side of the heat radiating sheet 21. A flow channel 29 for passing a cooling medium is formed in the cooling member 24 sand heat from the heat radiating sheet 21 and setting face 3 is removed and discharged out of the system. If the cooling member 24 is installed, the setting face 3 can be set at a desired temperature and therefore, it is preferable.

Adjustment of the temperature of the cooling medium and the temperature of the heat radiating sheet 21 makes it possible to adjust the temperature as described and particularly to set the temperature lower than a room temperature. Since the gas is packed in the setting face 3 by the circular projected part 3a, the temperature difference in the face of the wafer W can preferably be narrowed. The material of the cooling member 24 is preferably a metal having a high thermal conductivity and Al, an Al alloy, an Al—Cu composite material, and a composite material of a metal and SiC or AlN are preferable to be used.

The electrostatic chuck 1, the heat radiating sheet 21, and the cooling member 24 are preferable to be stuck by organic adhesive layers 26 and 28. The organic adhesive layers 26 and 28 have a function of moderating the difference of the thermal expansion between the electrostatic chuck 1 and the heat radiating sheet, the difference of the thermal expansion between the heat radiating sheet 21 and the cooling member 24, the difference of the thermal expansion between the plate-shaped ceramic body and the cooling member 24 to preferably lessen the risk of occurrence of cracking or separation in the adhesion face uniformly if the heat cycles of heating and cooling. As the adhesive, soft resins such as imide resins, epoxy resins, silicone resins, and phenol resins are preferable and silicone resins are particularly preferable.

Further, although not illustrated, the outer circumferences of the above-mentioned organic resin layers 26, 28 may be covered with Teflon (registered trade name) resins or the like with excellent corrosion resistance to increase the corrosion resistance against plasma.

The volume resistivity of the plate-shaped ceramic body 2 at 40° C. is preferably $10^8$ to $10^{12}$ Ω·cm. Particularly, it is preferably $10^9$ to $10^{11}$ Ω·cm. If the volume resistivity is smaller than $10^8$ Ω·cm, the leakage current to the object to be held from the plate-shaped ceramic body 2 becomes significant and it may possibly cause damages on the object to be held such as a wafer. If the volume resistivity is higher than $10^{12}$ Ω·cm, Johnsen-Rahbek adhesion effect is decreased and it may be impossible to obtain sufficient attraction power.

The plate-shaped ceramic body 2 is preferable to contain alumina or aluminum nitride (AlN) as a main component. Alumina and AlN are resistant to corrosion by a corrosive gas including fluorine or chlorine and plasma and thus suppress particle formation and prolong the life of the product.

Particularly, the metal impurity in AlN is suppressed preferably to be 2% by weight or less, more preferably to be 1% by weight or less, and uniformly more preferably to be 0.5% by weight or less.

The plate-shaped ceramic body 2 is preferable to contain alumina as a main component and a Group 4 element compound as a trace component. Addition of the Group 4 element compound to alumina makes it possible to give a volume resistivity of $10^8$ to $10^{12}$ Ω·cm to the plate-shaped ceramic body 2. As the Group 4 element is preferably Ti, Zr, and Hf and oxides, carbides, and nitrides of these elements are preferable. The addition amount of the oxide of the Group 4 element is preferably 0.5% by weight to 15% by weight and more preferably 3 to 8% by weight. If it is lower than 0.5% by weight, the volume resistivity may possibly exceed $10^{12}$ Ω·cm and if it exceeds 14% by weight, it may possibly lower $10^8$ Ω·cm.

Such an alumina-based ceramic body can be obtained by using an alumina powder with an average particle diameter of 1 μm or smaller, adding a Group 4 oxide powder, mixing and pulverizing the powder mixture, and firing the mixture in non-oxidizing atmosphere. The firing temperature is preferable to be 1300° C. or lower. If the temperature exceeds 1300°

C., the Group 4 oxide reacts with alumina and therefore, they form a compounded oxide. Consequently, owing to the anisotropy of the thermal expansion coefficient of the compounded oxide, cracks tend to be formed in the ceramic body. It is more preferably 1200 to 1250° C. In the case the firing is carried out in the atmosphere at normal pressure, to heighten the density of the sintered body, hot pressurizing treatment is preferable to be carried out to densify the sintered body and give a relative density of 99% or higher.

Alternatively, it is preferable to carry out pressure sintering in non-oxidizing atmosphere.

Next, other constitution of the invention will be described.

Examples usable as the metal composing the electrode 6 for electrostatic attraction of the electrostatic chuck 1 made of mainly alumina or aluminum nitride may be W, Mo, Pt, Au, Ag, Ni, TiN, WC, $W_2C$, TiC, $TiB_2$, and Ti. In the case the electrode 6 for electrostatic attraction is to be formed in the inside of the substrate having the setting face 3 (hereinafter, referred to a built-in electrode for short), in consideration of the conductivity and the high firing temperature, W, WC, and Mo are preferable as the metal. In the case the electrode 6 for electrostatic attraction is to be formed in the rear face of the setting face 3, any of the above exemplified W, Mo, Pt, Au, Ag, Ni, TiN, WC, $W_2C$, TiC, $TiB_2$, and Ti may be used.

The relative density of the electrode 6 for electrostatic attraction is preferably 90% or higher, more preferably 95% or higher, and 97% or higher. Accordingly, large pore formation in the electrode 6 for electrostatic attraction can be suppressed and as a result, the attraction power distribution in the plane can made easy to be uniformly.

Further, the density of the plate-shaped ceramic body 2 is preferable to be 98% or higher and particularly preferable to be 99% or higher. The maximum pore diameter is preferable to be 2 μm or smaller and particularly preferable to be 1 μm or smaller. Since the size of the pore existing in the surface is smaller than 2 μm and the number of the pores exiting in the surface is low, it becomes easy to control the arithmetic mean deviation Ra to 1.2 or smaller.

Next, a method for manufacturing the electrostatic chuck of the invention will be described by exemplifying production of a wafer holding member 100 shown in FIG. 5 using alumina and an AlN wintered body as the plate-shaped ceramic body.

First, an alumina ($Al_2O_3$) powder is prepared as a starting raw material. As the alumina powder, an easily sinter-able type alumina to be sintered at a sintering temperature of 1300° C. or lower and having an average particle diameter of 1.2 μm or smaller is preferable. Titanium oxide fine particles with an average particle diameter of 1 μm or smaller are added as a trace component to the alumina powder. Titanium oxide is preferable to have the rutile structure in terms of easy controllability of the volume resistivity. The alumina powder and the titanium oxide powder are pulverized and mixed by using a vibration mill and a ball mill to produce a slurry. The produced slurry is mixed with an organic binder and then granulated and dried by a method for spray drying to obtain a composite material as a starting material.

The starting material is packed in a metal die to form a substrate. In the case an electrode for electrostatic attraction is to be embedded, the electrode for electrostatic attraction is formed in a molded body by a method for printing and a formed substrate is layered in a manner of surrounding the electrode for electrostatic attraction and again pressure molding the resulting body to obtain a molded body in which the electrode for electrostatic attraction is embedded.

Then, the molded body may be sintered at 1200 to 1300° C. in a furnace in nitrogen gas atmosphere. If the alumina raw material has a low sintering property, the sintered body obtained in the above-mentioned manner may be subjected to pressurizing and heating treatment at 1200° C. and 2000 atmospheric pressure for 1 hour to obtain a plate-shaped ceramic body of the sintered body with a relative density of 99% or higher.

Next, the plate-shaped ceramic body of aluminum nitride will be described. An AlN powder is prepared as a starting material. With respect to the AlN powder, a powder produced by a method for a reductive nitridation is preferable since it has an excellent sintering property. To adjust the volume resistivity of the AlN sintered body within a desired range, it is preferable to add cerium oxide in an amount of 1 to 15% by weight. Further, the starting material may contain metal impurities to an extent that the impurities cause no effect on the attraction power, however to obtain a sintered body excellent in the corrosion resistance, it is preferable to suppress metal other than Al to 2% by weight or less, more preferably 1% by weight or less, and uniformly more preferably 0.5% by weight or less.

Since Carbon affects the sintering property, the amount of carbon is controlled preferably 1% by weight or less, more preferably 0.5% by weight or less, and uniformly more preferably 0.3% by weight or less. The oxygen amount in the sintered body is preferably 3% by weight or less, more preferably 2% by weight or less, and uniformly more preferably 1% by weight or less. Accordingly, it is made possible to obtain a sintered body to be the plate-shaped ceramic body excellent in the corrosion resistance.

The above-mentioned aluminum nitride powder is formed into a desired shape in which the electrode for electrostatic attraction is formed in the inside if necessary. Molding may be carried out by a molding method using a die press, CIP, a tape molding, casting, or the like. The molded body may be pre-sintered after the binder component needed at the time of molding is removed.

In the case of producing an electrostatic chuck in which the electrode for electrostatic attraction is embedded, a pair of molded bodies and/or pre-sintered bodies with a relative density difference 5% or lower are prepared; a paste containing a metal such as W and Mo and/or a metal compound such as TiN, a ceramic sintered body to be a main component, an organic binder, and a solvent is applied to one of the molded bodies and/or the pre-sintered bodies to form an electrode; and then these components are layered in a manner that the electrode is sandwiched between the molded bodies and/or pre-sintered bodies to form the electrode for electrostatic attraction. Further, as another method, an electrode is printed on a tape-like molded body and pre-fired, and then the electrode may be inserted between a pair of press pre-fired bodies.

In this case, it is preferable that the molding carried out by a die press and the relative density difference or the pre-fired and pressed body and the tape pre-fired body is suppressed to be 10% or less and more preferably to be 5% or less. Accordingly, the separation and crack formation can efficiently be suppressed.

At the time of forming the electrode for electrostatic attraction, it is desirable to previously investigate the shrinkage after firing and determine the thickness of the electrode for electrostatic attraction at the time of formation so as to form the electrode for electrostatic attraction in a thickness of 7 μm or thicker after sintering. For example, although it depends on the composition, the concentration, the viscosity, and pressing pressure of the paste for electrode formation, the thickness of the electrode for electrostatic attraction is controlled to be preferably 10 µm or thicker, more preferably 20 µm or thicker, and uniformly more preferably 30 µm or thicker.

The molded body or the pre-fired body to apply the paste for the electrode for electrostatic attraction thereto is preferable to have a flatness degree of 200 µm or less, more preferably 100 µm or less, and uniformly more preferably 50 µm or less. Accordingly, the dispersion of the average distance from the setting face to the electrode for electrostatic attraction can easily be controlled.

Next, a structural body of the molded body in which the electrode for electrostatic attraction is embedded is to be fired and before the firing, if necessary, a binder component may be removed. Further, the firing may be carried out by a hot press method, a normal pressure firing method, and a gas pressure firing method. In some cases, HIP and heat treatment may be carried out.

Firing will be described while exemplifying the hot press method. First, the above-mentioned structural body is set in a carbon die of a hot press apparatus and it is important that heating is carried out after pressure lower than the strength of the structural body is applied. If no pressure is applied, shrinkage or deformation occurs owing to the heating and if the pressure is equal to or higher than the strength of the structural body, the sample is cracked by the pressure and disconnection of the electrode-formed part and significant deformation is caused and disconnection and deformation can be prevented by the method carried out as described above.

Next, it is preferable to keep the structural body at a temperature lower than the firing temperature. This step of keeping the temperature is effective to make the temperature of the structural body uniformly and the temperature to be kept constant is preferably within a range from 1300 to 1700° C., which is close to the shrinkage starting temperature. Also, the pressure at the time of the keeping step is preferable to be lower than the strength of the structural body and particularly preferable to be set at 0.1 to 3 MPa. The temperature-keeping duration is preferable to be 20 minutes or longer and particularly preferable to be 1 hour or longer to keep the temperature of the entire structural body uniformly.

On completion of the temperature-keeping step, heating is started again and in a temperature range from the shrinkage starting temperature ±100° C., the pressurizing pressure is set to be the pressure equal to or higher than the strength of the structural body. The pressurizing treatment makes it possible to carry out primary shrinkage while amending deformation of the electrode and keep the electrode flat. The above-mentioned temperature at the time of starting pressurizing is preferable in a range of the shrinkage starting temperature ±50° C. On completion of the temperature-keeping step, the pressurizing treatment may be started simultaneously with the re-starting of the heating.

The shrinkage-starting temperature here means the crossing point of an extrapolated straight line at the time of not shrinking and an extrapolated tangent line of the curve at the time of shrinkage in the size shrinkage curve formed in the case of heating at a constant heating speed.

The structural body is fired at a temperature of 1750 to 1900° C. to obtain a ceramic sintered body including the electrode embedded therein. The firing is preferable to be carried out at the above-mentioned temperature for 20 minutes or longer, particularly preferable to be 1 hour or longer and accordingly, a dense body can stably be obtained.

Further, after the time when the structural body is shrunk to an extent of 90% in the entire shrinkage, it is preferable to apply pressure higher than the pressure at the time of firing to further correct the deformation of the electrode. Accordingly, the variations of the distance from the surface of the sintered body to the electrode can further be narrowed.

The firing pressure is preferable to be 0.1 MPa or higher to obtain 99% or higher relative density. The speed of the pressure application is not particularly limited.

Accordingly, for example, as the initial pressure, pressure of 0.1 to 0.2 MPa is applied continuously at 1600° C. for 1 hour and heating is started again and pressure of 30 MPa is applied at 1700° C. and firing is carried out at 1850° C. for 2 hours.

In the case the ceramic sintered body contains an aluminum nitride crystal phase as a main body, to prevent local deformation and difference of the shrinkage degree in portions and stress deformation due to the non-uniform dispersion of a sintering aid, it is preferable that the content of metals other than Al is suppressed to be 1% by weight.

Next, a method for forming the setting face according to the invention using the plate-shaped ceramic of alumina and aluminum nitride will be described. First, the ceramic substrate having the setting face is processed to be in a flat shape by a leveling and grinding apparatus. Then, gas holes, setting face and gas groove are formed by drilling and grinding machining.

After that, in the case the electrode for electrostatic attraction is not embedded in the plate-shaped ceramic body 2, a metal thin film layer is formed as the electrode for electrostatic attraction on the other main face of the plate-shaped ceramic body 2 by a plating method, a sputtering method, or an evaporation method and the electrode for electrostatic attraction with a desired shape is formed by etching to produce the electrostatic chuck 1. The exposed face of the electrode for electrostatic attraction may be covered with an insulating film such as a polyimide film to keep the insulation.

A heat radiating sheet is stuck to the face in which the above-mentioned electrode 6 for electrostatic attraction is formed through the adhesive layer 26. A soft resin such as an imide resin, an epoxy resin, a silicone resin, and a phenol resin may be used as the adhesive layer 26. Also, a powder or a bulk of a metal and a ceramic may be added properly to heighten the thermal conductivity. Additionally, the setting face may be processed after adhesion. The heat radiating sheet 21 is obtained by covering a resistor heating element 22 with an insulator. And as the insulator, similarly to the above-mentioned adhesive layer 26, an imide resin, an epoxy resin, a silicone resin, and a phenol resin may be used.

The heat radiating sheet 21 may be attached similarly in the case of the plate-shaped ceramic body 2 in which the electrode 6 for electrostatic attraction is embedded.

Next, after the heat radiating sheet 21 is stuck to the above-mentioned electrostatic chuck 1, the cooling member 24 is stuck and fixed to the heat radiating sheet 21 through the adhesive layer 28. An imide resin, an epoxy resin, a silicone resin, and a phenol resin may be used as the adhesive layer.

Next, the shape of the setting face 3 is precisely ground. The circular projected part 3a is ground while being rotated around the center of the plate-shaped ceramic body 2 by a rotary grinding machining, so that the arithmetic mean deviation of the circular projected part 3a can be controlled within a desired small range of the dispersion. Finishing of the grinding is carried out so as to control the arithmetic mean deviation Ra of the circular projected part 3a to be 1.2 µm or less and more preferably 0.5 to 1.2 µm and the maximum roughness Ry to be 2 or less. The gas packing face 3b is preferable to be processed toward the center of it from the outer circumference neighboring to the circular recessed part 4 while the plate-shaped ceramic body 2 is rotated. In this case the height of the circular projected part 3a is preferable to be higher than the height of the center of the gas packing face 3*b* by about 10 to 100 μm. The wheel stone speed in the diameter direction of the plate-shaped ceramic body is kept constant so as to keep the height of the center of the gas packing face 3*b* and the moving speed of the work is adjusted to be relatively slow at the center of the plate-shaped ceramic body so as to keep the surface roughness slight in the center part of the gas packing face 3*b* and the surface roughness coarse in the circumferential rim. Further, a practical grinding margin in the center part of the gas packing face 3*b* becomes wide and the recessed part can be formed.

In this connection, after the wafer holding member 100 in which the above-mentioned cooling member 24 is stuck and fixed is produced, the shape of the setting face 3 is preferable to be processed precisely, however if the deformation of the plate-shaped ceramic body 2 is small in the adhesion step, after a single product of the plate-shaped ceramic body 2 or a plate-shaped ceramic body 2 in which the electrode 6 for electrostatic attraction is formed is produced, the shape of the setting face 3 can be processed precisely.

The method for manufacturing the wafer holding member 100 provided with the resistor heating element 6 is described above, and a wafer holding member in which only the cooling member 21 except the heat radiating sheet 21 is stuck and fixed may be used similarly in accordance with the uses.

The wafer holding member 100 of the invention is used suitably as an apparatus for manufacturing particularly a semiconductor including a liquid crystal. That is, in the manufacturing process, an object to be held such as the wafer W is fixed on the setting face 3 of the electrostatic chuck 1 according to the invention and transportation, etching treatment, and film formation treatment can efficiently be carried out to fabricate highly reliable semiconductors at a high productivity and low cost.

Example 1

An aluminum nitride powder with an average particle diameter of 1 μm and produced by a method for a reductive nitridation was used as a raw material. Further, a carbon powder with an average particle diameter of 1 μm and 10% by weight of a $CeO_2$ powder with an average particle diameter of 1 μm were added and the resulting powder mixture was adjusted so as to suppress metals other than Al to 1% by weight or less and mixed.

The mixed powder was further mixed with ethanol and a binder to obtain a powder for molding. The powder for molding was molded in a disk-like shape with a diameter of 400 mm and a thickness of 6 mm by a press molding. Further, the powder was molded into a shape with a diameter of 80 mm and a thickness of 4 mm as a sample for measurement. An electrode was formed by using a paste containing WC, AlN and an organic binder. A pair of disks were layered while sandwiching the electrode and the pair of the disks layered in such a manner were pressed and the resulting molded body was degreased to obtain a structural body. The structural body was put in an AlN crucible and fired in a firing furnace. The firing was carried out at 1850° C. for 2 hours after previous heating at a temperature of 1650° C. near the shrinkage stating temperature for 1 hour.

Next, the sintered body of the above-mentioned disks was subjected to outer diameter machining to adjust the diameter to be 300 mm. Further, gas holes, setting face and gas groove were formed by drilling.

After that, a heat radiating sheet was stuck to the above obtained disk by a silicone adhesive and further a cooling member made of an aluminum alloy was stuck to the heat radiating sheet stuck to the disk by a silicone adhesive.

After the setting face of each sample of the invention obtained in the above-mentioned manner was ground for adjusting the thickness by a plane grinding machine, the entire setting face was finished to adjust the surface roughness of a circular projected part to be Ra as shown in Table 1 by a rotary grinding machine. At that time, the height of the circular projected part was made to be higher by about 10 μm than the center part of the setting face portion from the groove to the center. After that, the gas packing face was similarly ground by a rotary grinding machine to obtain an electrostatic chuck having the structure shown in FIG. 5. Respective samples No. 1 to 6 were obtained.

Further, samples of Comparative Examples were obtained by grinding the setting faces of electrostatic chucks by a plane grinding machine. The surface roughness was adjusted by changing diamond wheel stones having abrasive particles size #80, #120, and #320, respectively.

These samples were individually set in vacuum containers and after the pressure in a film formation container was reduced to 0.1 Pa and while cooling water at 20° C. was circulated to the cooling member, a wafer W was set on the setting faces of the samples and 500 V voltage was applied to the electrodes for electrostatic attraction and helium gas of 2.6 kPa was supplied to the gas supply holes and electric power was supplied to the resistor heating elements properly to keep the average temperature of the surfaces of the wafer W at 100° C.

Then, the surface temperature of each wafer W was measured by 32 thermocouples attached to the surface of the wafer W. The temperature was measured after 10 minutes from the time when the average temperature of these 32 thermocouples reached 100° C. and the difference of the highest temperature and the lowest temperature was defined to be the temperature difference in the wafer face. The results are shown in Table 1.

TABLE 1

| Sample No. | The average value of the arithmetic mean deviation of the circular projected part | The ratio of the maximum value and the minimum value of the arithmetic mean deviation | The temperature difference in the wafer face (° C.) |
|---|---|---|---|
| 1 | 0.083 | 0.20 | 1.8 |
| 2 | 0.095 | 0.17 | 1.7 |
| 3 | 0.110 | 0.16 | 1.4 |
| 4 | 0.550 | 0.05 | 0.9 |
| 5 | 0.850 | 0.14 | 1.1 |
| 6 | 1.110 | 0.16 | 1.2 |
| * 7 | 0.091 | 0.25 | 2.5 |

TABLE 1-continued

| Sample No. | The average value of the arithmetic mean deviation of the circular projected part | The ratio of the maximum value and the minimum value of the arithmetic mean deviation | The temperature difference in the wafer face (° C.) |
|---|---|---|---|
| * 8 | 0.570 | 0.30 | 3.2 |
| * 9 | 1.100 | 0.32 | 5.6 |

The mark * shows out of the scope of the invention.

With respect to the samples No. 1 to No. 6 of Examples of the invention which had the ratio of 0.2 or lower calculated by dividing the difference of the maximum value and the minimum value of the arithmetic mean deviation of the circular projected parts by the maximum value, the temperature difference in the wafer face was 1.8° C. or lower and these samples were found having excellent properties.

On the other hand, the samples No. 7 to No. 9 of Comparative Examples had the above-mentioned ratio of 0.25, 0.30, and 0.32, respectively and the temperature difference in their wafer faces was no lower than 2.5° C. and thus these samples were found having inferior properties.

Example 2

Heat radiating sheets and cooling members were stuck to electrostatic chucks in the same manner as Example 1 and the circular projected parts were ground in the same manner by a rotary grinding machine to obtain samples No. 21 to No. 23.

With respect to the samples No. 21 and No. 22, the gas packing faces was processed to be concave faces. The center parts of the gas packing faces were lowered and the difference of the average height of 5 points in the circular projected parts was adjusted to be 10 μm.

With respect to the sample No. 23, the gas packing face was made to be flat. The height of the center part in the gas packing face was lowered and the difference of the average height of 5 points in the circular projected parts was adjusted to be 10 μm.

Further, a sample No. 24 was machined using a rotary grinding machine to adjust the height of the circular projected part of the setting face and the height of the gas packing face to be the same.

With respect to the residual attraction power, wafers W were put on the respective setting faces and 500 V voltage (bipolar voltage 250 V) was applied same as Example 1 to heat the wafers to 100° C. and after 10 minutes, the applied voltage was lowered to 0 V and the time taken to sharply lower the pressure of the gas supply hole was measured as the wafer separation time. The results are shown in Table 2.

TABLE 2

| Sample No. | The average value of the arithmetic mean deviation of the circular projected part. | The height of the circular projected part is higher than the height of the gas packing face. | The smooth concave face is formed in the gas packing face. | The separation time (second) |
|---|---|---|---|---|
| 21 | 0.083 | ○ | ○ | 7.4 |
| 22 | 0.095 | ○ | ○ | 7.1 |
| 23 | 0.550 | ○ | X | 9.5 |
| 24 | 1.110 | X | X | 15.3 |

○ shows the above-mentioned condition is satisfied.

X shows the above-mentioned conditions is unsatisfied.

Samples No. 21 and No. 22 each having the higher top face height of the circular projected part than the height of the gas packing face and having a smooth concave face of the gas packing face were found preferable, having the separation time of 7.4 second or shorter.

Samples No. 23 had the separation time of 9.5 second, slightly longer than those of Samples No. 21 and No. 22.

With respect to Sample No. 24 having a flat setting face was found having a rather long separation time, 15.3 second.

Example 3

Plate-shaped ceramic bodies were produced in the same manner as Example 1 and a metal Ti film was formed in the undersurface of each plate-shaped ceramic body to use it as an electrode for electrostatic attraction. The width of a circular projected part was set to be 1.5 mm and a circular recessed part with a width of 1 mm was formed in the inside. The electrode for the electrostatic attraction was formed to be a parabolic toothcomb-like shape and its external shape was made to be circular. Samples No. 31 to No. 33 and No. 35 to No. 37 had the size of the outer diameter of the electrode for the electrostatic attraction same as the outer diameter of the circular recessed part. Sample No. 34 had the outer diameter of the electrode for electrostatic attraction same as the inner diameter of the circular recessed part.

These Samples were individually set in the vacuum container and heated to 100° C. in the same manner as Example 1. The temperature difference in each wafer face was measured after 10 minutes. Gas leakage amount was calculated from the supplied gas amount. The results are shown in Table 3.

Meanwhile, Sample No. 31 was not preferable since it had the arithmetic mean deviation so small as 0.32 and therefore had the temperature difference in the wafer face so wide as 1.92° C.

Also, Sample No. 37 was not preferable since it had the average value of the arithmetic mean deviation of the circular projected part so high as 1.5 and the gas leakage amount so much as 4.5 sccm.

With respect to Sample No. 34, since electrode for electrostatic attraction was not laid to the portion under the circular recessed part, the gas leakage amount was so high as 3-6 sccm.

Example 4

Plate-shaped ceramic bodies were produced by using alumina and aluminum nitride as materials for plate-shaped ceramic bodies and adding the additives to give the compositions shown in Table 4.

With respect to the volume resistivity, it was measured at 40° C. by a three-terminal method according to JIS C2141.

The volume resistivity of each plate-shaped ceramic body was measured and each plate-shaped ceramic body was set in

TABLE 3

| Sample No. | The average value of the arithmetic mean deviation of the circular projected part. | The electrode for the electrostatic attraction is laid to the portion under circular recessed part. | Temperature difference in the wafer face (° C.) | The gas leakage amount (sccm) |
|---|---|---|---|---|
| 31 | 0.32 | ○ | 1.92 | 1.5 |
| 32 | 0.51 | ○ | 0.97 | 1.4 |
| 33 | 0.70 | ○ | 0.95 | 1.2 |
| 34 | 0.70 | X | 0.95 | 3.6 |
| 35 | 0.92 | ○ | 0.92 | 1.1 |
| 36 | 1.20 | ○ | 0.93 | 1.2 |
| 37 | 1.50 | ○ | 3.60 | 4.5 |

○ shows the above-mentioned condition is satisfied.
X shows the above-mentioned conditions is unsatisfied.

Samples No. 32, No. 33, No. 35 and No. 36 each having an electrode for the electrostatic attraction laid to the portion under circular recessed part and an arithmetic mean deviation Ra of the circular projected part in a range of 0.5 to 1.2 were found preferable, having the temperature difference in the wafer face less than 1° C. and the gas leakage amount as slight as 1.4 sccm or lower.

a vacuum container and heated at 100° C. in the same manner as Example 1. The temperature difference in each wafer face and the gas leakage amount were measured.

A silicon wafer of 1 inch square size was put on each setting face and 500 V voltage was applied to the electrode for electrostatic attraction to carry out heating at 100° C. while the silicon wafer was pulled up and the maximum power at the time when the wafer was separated was defined as the electrostatic attraction power. The measurement results are shown in Table 4.

TABLE 4

| Sample No. | Material of plate-shaped ceramic body | Materials of trace additives | Content of trace additives (% by weight) | volume resistivity at 40° C. (Ω·cm) | Electrostatic attraction power (kPa) | Temperature difference in the wafer face (° C.) | Gas leakage amount (sccm) |
|---|---|---|---|---|---|---|---|
| 41 | $Al_3O_3$ | $TiO_2$ | 1.0 | $2.2 \times 10^{13}$ | 12.3 | 1.92 | 5 |
| 42 | $Al_2O_3$ | $TiO_2$ | 3.0 | $1.0 \times 10^{12}$ | 36.9 | 0.97 | 1.1 |
| 43 | $Al_2O_3$ | $TiO_2$ | 5.1 | $5.1 \times 10^{11}$ | 38.4 | 0.95 | 0.9 |
| 44 | $Al_2O_3$ | $TiO_2$ | 8.0 | $3.8 \times 10^{9}$ | 46.5 | 0.92 | 0.8 |
| 45 | $Al_2O_3$ | $TiO_2$ | 13.0 | $6.4 \times 10^{8}$ | 28.4 | 0.92 | 2.3 |
| 46 | $Al_2O_3$ | $ZrO_2$ | 4.0 | $3.1 \times 10^{11}$ | 29.2 | 0.92 | 0.8 |
| 47 | $Al_2O_3$ | $HfO_2$ | 3.5 | $8.4 \times 10^{11}$ | 31.5 | 0.92 | 0.9 |
| 48 | $Al_2O_3$ | TiC | 3.5 | $7.3 \times 10^{9}$ | 32.8 | 0.92 | 0.8 |
| 49 | $Al_2O_3$ | ZrC | 3.5 | $2.5 \times 10^{10}$ | 31.4 | 0.92 | 0.8 |
| 50 | AlN | $CeO_2$ | 5.0 | $3.8 \times 10^{11}$ | 38.4 | 0.92 | 0.9 |
| 51 | AlN | $CeO_2$ | 10.0 | $2.2 \times 10^{10}$ | 42.8 | 0.92 | 0.7 |
| 52 | AlN | $CeO_2$ | 14.0 | $4.1 \times 10^{9}$ | 41.2 | 0.92 | 0.7 |

Samples No. 42 to No. 52 having the volume resistivity in a range of $10^8$ to $10^{12}$ Ω·cm were found preferable, having the temperature difference in the wafer face less than 1° C. and gas leakage amount less than 3 sccm.

On the other hand, Sample No. 41 having the volume resistivity of $2.2 \times 10^{13}$ Ω·cm had the temperature difference in the wafer face rather high as 1.92° C. and the gas leakage amount also rather high a 5 sccm.

Samples No. 42 to No. 52 having the plate-shaped ceramic bodies of mainly alumina or aluminum nitride were found having the temperature difference in the wafer face lower than 1° C. and the gas leakage amount as low as 2.3 sccm or lower.

Particularly, in the case of Samples No 42 to No. 49, the wafer holding members made of plate-shaped ceramic bodies containing mainly alumina and further containing Group 4 compound such as $TiO_2$, $ZrO_2$, $HfO_2$, TiC, and ZrC were found having excellent properties since their electrostatic attraction power was as high as 28 kPa or higher.

Further, the wafer holding members made of plate-shaped ceramic bodies containing 3 to 8% by weight of titanium oxide or plate-shaped ceramic bodies containing mainly aluminum nitride and further containing cerium oxide were found preferable since their electrostatic attraction power was as high as 36 kPa or higher and their gas leakage amount was as low as 1.1 sccm or lower.

What is claimed is:

1. An electrostatic chuck provided with a plate-shaped ceramic body having a pair of main faces, which comprises
    a setting face to put an object to be held at one of the main faces,
    an electrode for electrostatic attraction at the other main face or inside the plate-shaped ceramic body,
    a circular projected part formed in the outer circumferential rim part of the setting face, the circular projected part being brought into contact with the object, and
    through holes formed in the inside of the circular projected part,
    wherein Ra(max) and Ra(min) which denote a maximum value and a minimum value of the arithmetic mean deviation Ra of the face to be brought into contact with the object respectively satisfy $0.05 \leq \{Ra(\text{max}) - Ra(\text{min})\}/Ra(\text{max}) \leq 0.2$.

2. The electrostatic chuck according to claim 1, wherein the plate-shaped ceramic body has a circular recessed part in an inside of the circular projected part.

3. The electrostatic chuck according to claim 2, wherein the setting face has a smooth concave face inside of the circular recessed part and the face of the circular projected part to be brought into contact with the object is projected higher than the recessed part.

4. An electrostatic chuck provided with a plate-shaped ceramic body having a pair of main faces, which comprises
    a setting face to put an object to be held at one of the main faces,
    an electrode for electrostatic attraction at the other main face or inside the plate-shaped ceramic body,
    a circular projected part formed in the outer circumferential rim part of the setting face, the circular projected part being brought into contact with the object, and
    through holes formed in the inside of the circular projected part,
    wherein Ra(max) and Ra(min) which denote a maximum value and a minimum value of the arithmetic mean deviation Ra of the face to be brought into contact with the object respectively satisfy $\{Ra(\text{max}) - Ra(\text{min})\}/Ra(\text{max}) \leq 0.2$, wherein the plate-shaped ceramic body has a circular recessed part in an inside of the circular projected part,
    wherein the setting face has a smooth concave face inside of the circular recessed part and the face of the circular projected part to be brought into contact with the object is projected higher than the recessed part,
    wherein the arithmetic mean deviation Ra becomes smaller toward the center of the concave face.

5. The electrostatic chuck according to claim 1, wherein the electrode for electrostatic attraction is formed on the opposite to the setting face except for the circular projected part.

6. The electrostatic chuck according to claim 2, wherein the electrode for electrostatic attraction is formed on the opposite to the circular recessed part and a part inside the circular projected part.

7. The electrostatic chuck according to claim 3, wherein the electrode for electrostatic attraction is formed on the opposite to the smooth concave face and the circular recessed part.

8. The electrostatic chuck according to claim 1, wherein the arithmetic mean deviation Ra of the circular projected part is in a range of 0.5 to 1.2.

9. The electrostatic chuck according to claim 3, wherein the arithmetic mean deviation Ra of the circular projected part is in a range of 0.5 to 1.2.

10. A wafer holding member which has a heat radiating sheet in the other main face side of the electrostatic chuck of the claim 1.

11. A wafer holding member which has a heat radiating sheet in the other main face side of the electrostatic chuck of the claim 3.

12. The wafer holding member according to claim 10, further comprising a cooling member in the undersurface side of the heat radiating sheet.

13. A wafer holding member which has a heat radiating sheet in the other main face side of a electrostatic chuck provided with a plate-shaped ceramic body having a pair of main faces, which comprises
- a setting face to put an object to be held at one of the main faces,
- an electrode for electrostatic attraction at the other main face or inside the plate-shaped ceramic body,
- a circular projected part formed in the outer circumferential rim part of the setting face, the circular projected part being brought into contact with the object, and
- through holes formed in the inside of the circular projected part,
- wherein Ra(max) and Ra(min) which denote a maximum value and a minimum value of the arithmetic mean deviation Ra of the face to be brought into contact with the object respectively satisfy
- $\{Ra(max)-Ra(min)\}/Ra(max) \leqq 0.2$, further comprising a cooling member in the undersurface side of the heat radiating sheet, wherein the heat radiating sheet and the cooling member are joined by an organic adhesive.

14. The wafer holding member according to claim 10, wherein a volume resistivity of the plate-shaped ceramic body at 40° C. is in a range of $10^8$ to $10^{12}$ $\Omega \cdot cm$.

15. The wafer holding member according to claim 12, wherein a volume resistivity of the plate-shaped ceramic body at 40° C. is in a range $10^8$ to $10^{12}$ $\Omega \cdot cm$.

16. The wafer holding member according to claim 10, wherein the plate-shaped ceramic body contains alumina or aluminum nitride as a main component.

17. The wafer holding member according to claim 12, wherein the plate-shaped ceramic body contains alumina or aluminum nitride as a main component.

18. The wafer holding member according to claim 16, wherein the plate-shaped ceramic body contains alumina or aluminum nitride as a main component and Group 4 element compound as a trace component.

* * * * *